US009927494B2

(12) United States Patent
Pollard et al.

(10) Patent No.: US 9,927,494 B2
(45) Date of Patent: Mar. 27, 2018

(54) TWELVE-PULSE AUTOTRANSFORMER RECTIFIER UNITS

(71) Applicant: Eaton Limited, Titchfield Hampshire (GB)

(72) Inventors: Brian Pollard, Andover (GB); Sivanehru Ramachandran, Camberley Surrey (GB)

(73) Assignee: EATON LIMITED, Titchfield Hampshire (GB)

( * ) Notice: Subject to any disclaimer, the term of this patent is extended or adjusted under 35 U.S.C. 154(b) by 343 days.

(21) Appl. No.: 14/417,813

(22) PCT Filed: Jul. 12, 2013

(86) PCT No.: PCT/EP2013/064799
§ 371 (c)(1),
(2) Date: Jan. 28, 2015

(87) PCT Pub. No.: WO2014/019834
PCT Pub. Date: Feb. 6, 2014

(65) Prior Publication Data
US 2015/0285871 A1 Oct. 8, 2015

(30) Foreign Application Priority Data

Jul. 30, 2012 (GB) .................................. 1213543.0

(51) Int. Cl.
*G01R 31/42* (2006.01)
*G01R 19/155* (2006.01)
(Continued)

(52) U.S. Cl.
CPC ........... *G01R 31/42* (2013.01); *G01R 19/155* (2013.01); *G01R 31/40* (2013.01); *H02M 1/32* (2013.01); *H02H 3/253* (2013.01); *H02M 7/08* (2013.01)

(58) Field of Classification Search
None
See application file for complete search history.

(56) References Cited

U.S. PATENT DOCUMENTS 3,313,984 A * 4/1967 Hupp ..................... H02H 3/24
327/465
4,027,204 A * 5/1977 Norbeck ............... H02H 3/253
340/663
(Continued)

FOREIGN PATENT DOCUMENTS

RU 2362262 C1 7/2009

OTHER PUBLICATIONS

Fco. Javier Chivite-Zabalza, "A Passive 36-Pule AC-DC Converter With Inherent Load Balancing Using Combined Harmonic Voltage and Current Injection", IEEE Transactions on Power Electronics, vol. 22, No. 3, May 2007, pp. 1027-1035.
(Continued)

*Primary Examiner* — Jermele M Hollington
*Assistant Examiner* — Suresh K Rajaputra
(74) *Attorney, Agent, or Firm* — Leydig, Voit & Mayer, Ltd.

(57) ABSTRACT

A method and apparatus for detecting a missing phase in a 3-phase twelve-pulse autotransformer rectifier unit (ATRU) which, in use, receives a 3-phase input and delivers a nominal DC output on which a common-mode voltage is impressed. At least one of the frequency and amplitude of the common-mode voltage are monitored thereby to determine whether there is a missing phase in the input. The frequency and/or amplitude of the common-mode voltage may also be monitored thereby to determine whether there is a loss of input voltage.

14 Claims, 2 Drawing Sheets

(51) Int. Cl.
  *G01R 31/40* (2014.01)
  *H02M 1/32* (2007.01)
  *H02H 3/253* (2006.01)
  *H02M 7/08* (2006.01)

(56) References Cited

U.S. PATENT DOCUMENTS

| | | | | |
|---|---|---|---|---|
| 4,542,433 A | * | 9/1985 | Schaefer | H02H 3/253 307/127 |
| 4,802,053 A | * | 1/1989 | Wojtak | H02H 11/004 361/85 |
| 5,548,207 A | * | 8/1996 | Smith | G01R 31/42 324/107 |
| 5,665,256 A | * | 9/1997 | Toth | B23K 9/0956 219/130.21 |
| 7,633,185 B2 | * | 12/2009 | Rowell | H02H 11/004 307/127 |
| 7,667,988 B2 | | 2/2010 | Haeberle et al. | |
| 8,107,204 B2 | * | 1/2012 | Wu | G01R 19/2513 361/77 |
| 2003/0048006 A1 | * | 3/2003 | Shelter, Jr. | H02J 9/061 307/64 |
| 2004/0202012 A1 | | 10/2004 | Ferens | |
| 2006/0187683 A1 | * | 8/2006 | Hsieh | G01R 19/16547 363/10 |
| 2007/0041136 A1 | * | 2/2007 | Miettinen | H02H 3/253 361/85 |
| 2008/0080106 A1 | | 4/2008 | Mirafzal et al. | |
| 2012/0286766 A1 | * | 11/2012 | Lee | G01R 31/42 324/86 |

OTHER PUBLICATIONS

Uwe Drofenik, et al., "Comparative Evaluation of Three-Phase High-Power-Factor AC-DC Converter Concepts for Application in Future More Electric Aircraft", IEEE Transactions on Industrial Electronics, vol. 52, No. 3, Jun. 2005, pp. 727-737.

* cited by examiner

TWELVE-PULSE AUTOTRANSFORMER RECTIFIER UNITS

CROSS-REFERENCE TO RELATED APPLICATIONS

This application is a U.S. National Stage application under 35 U.S.C. § 371 of International Application No. PCT/EP2013/064799, filed on Jul. 12, 2013, and claims benefit to British Patent Application No. 1213543.0, filed on Jul. 30, 2012. The International Application was published in English on Feb. 6, 2014, as WO 2014/019834 A1 under PCT Article 21(2).

FIELD

This invention relates to twelve-pulse autotransformer rectifier units (ATRUs).

BACKGROUND

A twelve-pulse ATRU is a rectifier used to produce a DC output supply from a 3-phase AC power input. This type of rectifier is utilized, particularly in aircraft, because compared with the simplest possible 3-phase rectifier, a six-pulse rectifier, it gives a lower ripple on the DC output, and a lower level of harmonic currents in the three-phase input supply. In order to minimize the cost and weight of the phase-shifting transformer that is needed to realize the twelve-pulse scheme, it is made an auto-transformer.

It is important in such devices to be able to swiftly determine abnormalities such as a missing AC phase or a drop out of the input supply. If there is a missing phase only two of the three phases will be present at the rectifier and this can cause damage or malfunction of the equipment powered by the output of the ATRU. An input supply drop out can also be problematic in particular types of equipment powered by the output of the ATRU. For example in those which employ a sensorless square wave drive, it is vital that there is fast detection of an input supply drop out. This is needed because, in order to be able provide a 'hot' restart when the input power is reconnected, the bridge drive must be switched off within a very short time (typically 1 ms) of the input supply drop out, as the motor controller needs to keep track of the rotor position during the period the power is interrupted.

There are a number of existing proposals for detecting a missing phase. For example, U.S. Pat. No. 5,548,207 discloses a method in which the 3-phase supply being monitored is connected to the primary windings of an isolating transformer which steps down the voltages and supplies to them a rectifier. The ripple wave of the rectified output is analyzed to determine whether a missing phase is present. This technique requires a connection to the 3-phase supply and this may be problematic, particularly where access to or from the supply being monitored is awkward. For example, in the configurations proposed herein, the ATRU may be disposed within a fuel tank so that the fuel provides active cooling of the unit (thereby allowing weight reduction of the ATRU). The monitoring circuit will typically be external to the fuel tank and so in an arrangement of the type disclosed in U.S. Pat. No. 5,548,207, it would be necessary to provide additional sealed feed through connections to link the ATRU to the monitoring circuit.

SUMMARY

An aspect of the invention provides a method of detecting a missing phase in a 3-phase twelve-pulse autotransformer rectifier unit (ATRU), the ATRU, in use, receiving a 3-phase input and delivering a rectified nominal DC output on which a common-mode voltage is impressed, the method comprising: monitoring at least one of a frequency or an amplitude of the common-mode voltage so as to determine whether there is a missing phase in the 3-phase input.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
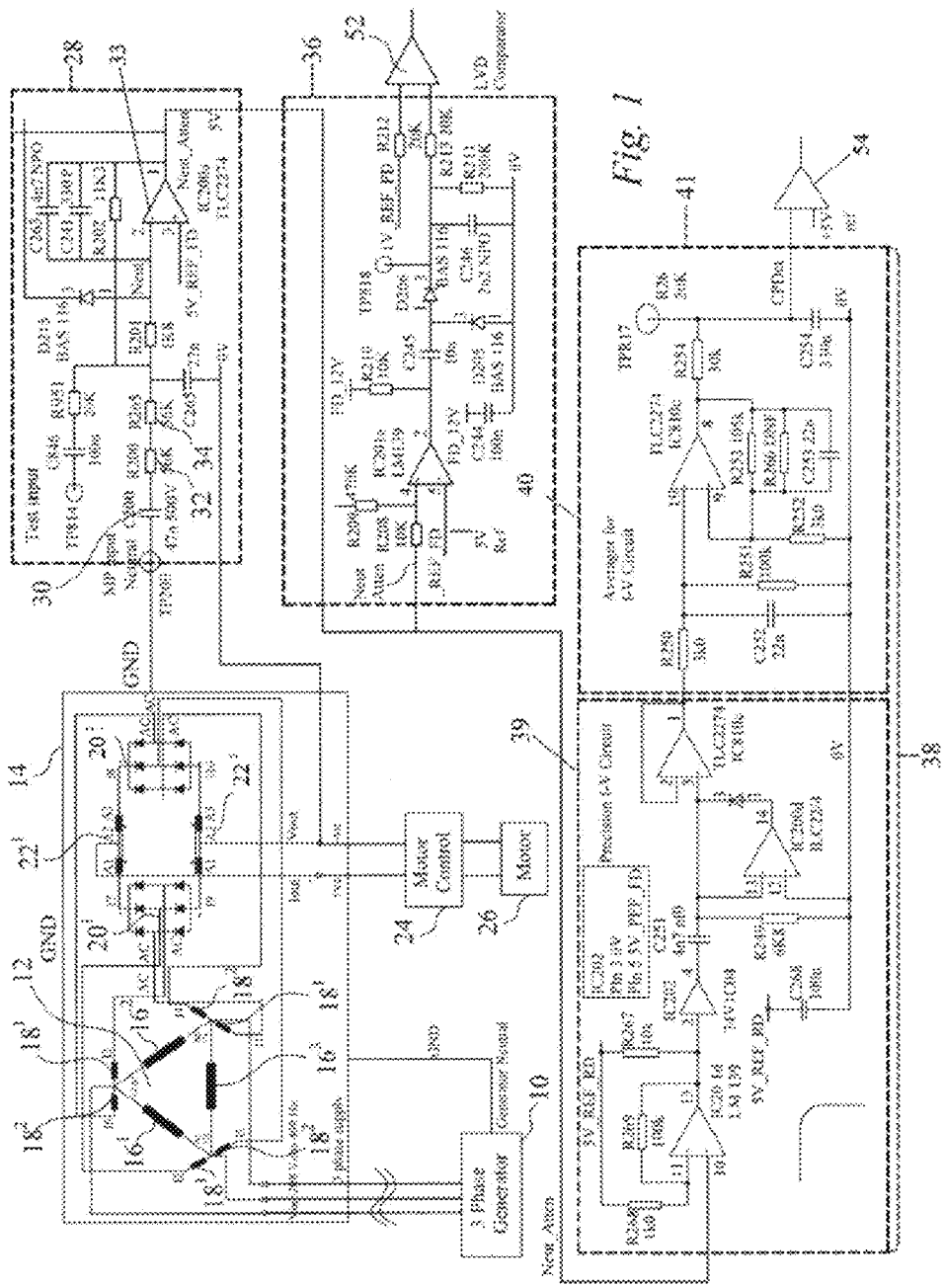
FIG. 1 is a diagram of a 3-phase twelve-pulse ATRU incorporating missing phase detection and input drop out protection in accordance with this invention.

An aspect of the invention provides a twelve-pulse autotransformer rectifier unit (ATRU), particularly, but not exclusively, methods and apparatuses for detecting particular conditions in the 3-phase supply thereto and/or the operation thereof.

We have found that, as a result of using an autotransformer configuration, a 3-phase, twelve-pulse autotransformer has a distinctive characteristic that the rectified nominal DC output has a common-mode voltage impressed on it, relative to the generator neutral voltage, which varies according to various operating conditions. We have therefore designed a system which is capable of monitoring the condition of the 3-phase supply to an ATRU which does not require a connection to each of the phases of the 3-phase supply, but instead monitors a common-mode voltage that appears on the rectified nominal DC output of the ATRU, relative to the generator ground.

An aspect of the invention provides a method of detecting a missing phase in a 3-phase twelve-pulse autotransformer rectifier unit (ATRU) which in use receives a 3-phase input and delivers a rectified nominal DC output on which a common-mode voltage is impressed, the method comprising monitoring at least one of the frequency and amplitude of said common-mode voltage thereby, to determine whether there is a missing phase in the input.

Thus in one arrangement the frequency of the common-mode voltage is detected and a missing phase event determined if the frequency of the common-mode voltage is below a preset threshold frequency. This may provide an indicative signal output or display a warning. The frequency detection may be effected using an analogue circuit or a digital circuit.

Alternatively or in addition, the amplitude of the common-mode voltage may be detected and a missing phase event determined if the amplitude of the common-mode voltage exceeds a preset amplitude threshold.

In addition to or instead of looking for a missing phase the method may look for an input supply drop out, again by monitoring the common-mode voltage relative to the generator ground.

Thus in another aspect the invention provides a method of detecting an input supply drop out in a 3-phase twelve-pulse autotransformer rectifier unit (ATRU) which in use receives a 3-phase input and delivers a rectified nominal DC output on which a common-mode voltage is impressed, the method comprising monitoring at least one of the frequency and amplitude of said common-mode voltage thereby, to determine whether there is an input supply drop.

Thus the amplitude of the common-mode voltage may be monitored and compared with a predetermined threshold amplitude.

The amplitude detection may be effected using an analogue circuit or a digital circuit.

In each of these aspects the common-mode voltage may conveniently be detected by reference to the 3-phase generator neutral voltage, or another ground reference.

The invention also extends to apparatus for detecting a missing phase in a 3-phase twelve-pulse autotransformer rectifier unit (ATRU) which in use receives a 3-phase input and delivers a rectified nominal DC output on which a common-mode voltage is impressed, the apparatus comprising a circuit for monitoring at least one of the frequency and amplitude of said common-mode voltage thereby to determine whether there is a missing phase in the input.

The invention further extends to apparatus for detecting an input supply drop-out in a 3-phase twelve-pulse autotransformer rectifier unit (ATRU) which in use receives a 3-phase input and delivers a rectified nominal DC output on which a common-mode voltage is impressed, the apparatus including a circuit for monitoring the amplitude of the common-mode voltage and determining if said amplitude is less than a predetermined threshold amplitude.

The apparatus and methods disclosed herein have the advantage that the control circuit does not need access to the 3-phase supply, which has benefits since allowing high voltages into a low-voltage control circuit adds cost and complexity. Furthermore the method of detection is cheaper and simpler than using a transformer, which is an alternative known method.

While the invention has been described above, it extends to any inventive combination of the features set out above or in the following description or drawings.

The embodiment and modifications disclosed herein are described in relation to a 3-phase power supply that is designed to supply power to a DC motor that operates a fuel pump. It will of course be appreciated that the circuits may readily be adapted to determine the condition of 3-phase power supplies in other applications.

Referring initially to FIG. 1, 3-phase power from a 3-phase generator 10 is supplied to a ATRU 12 of known circuit design. The 3-phase generator neutral voltage is connected to ground and the ATRU is mounted in a housing 14 which also is connected to ground. In this scheme, embodied in an aircraft, "ground" means the common air frame, or common ground network in the case of a composite aircraft. In the ATRU 12 the 3-phase supply is connected in known fashion to the three primary windings $16^1$, $16^2$, and $16^3$ in a delta configuration. At each apex, two secondary windings $18^1$, $18^2$ are connected and supply current to two arrays $20^1$, $20^2$ of diode pairs with rectified DC being output via two interphase transformers $22^1$, $22^2$ (also known as interphase reactors). The DC supply is passed to a motor control 24 and thence to a motor 26. The motor control controls the angular velocity and angular displacement of the motor.

Figure 2:
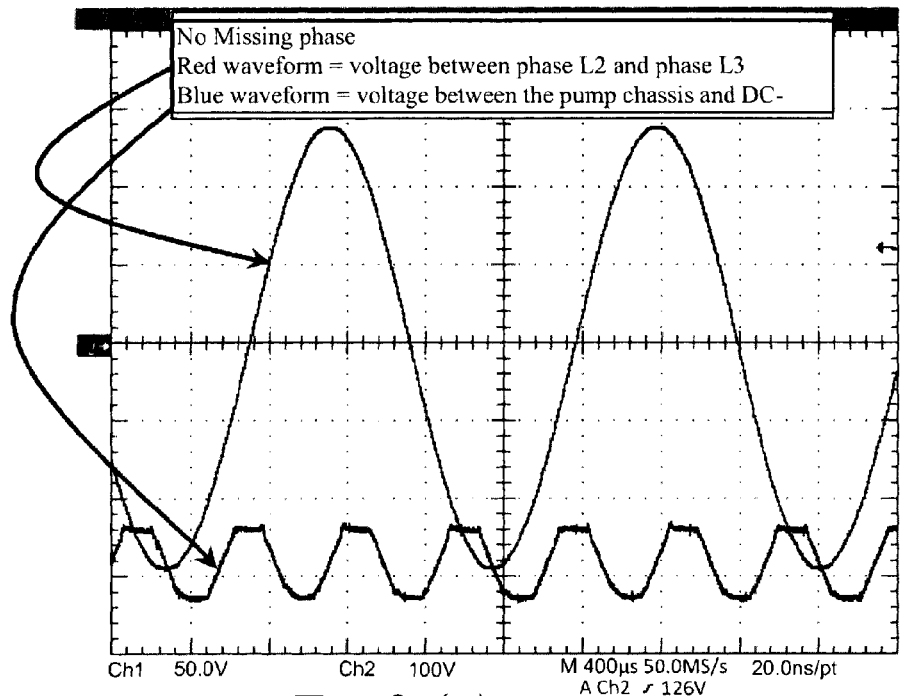
FIG. 2(a) is a graph showing the common-mode voltage impressed on the DC output of the ATRU when all three phases are present.
FIG. 2(b) is a graph similar to FIG. 2 (a) but showing the common-mode voltages when one of the phases is missing.
Figure 2:
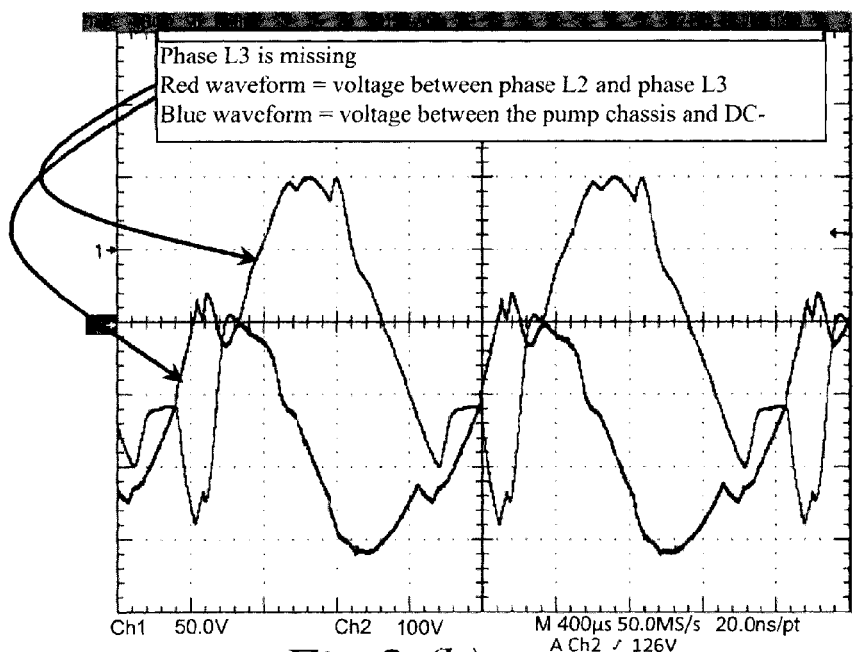

Our analysis of the ATRU circuit of the type above has revealed that for a twelve-pulse scheme, when all three phases are present, the DC output has a common-mode voltage impressed on it, relative to the generator neutral voltage, consisting of approximately half-sine pulses, with an amplitude of about 18 percent of the DC output voltage, and three times the input frequency (see FIG. 2(a)). When a missing phase event occurs, the common-mode voltage increases to about 54 percent of the DC output voltage, and becomes equal to the input frequency (see FIG. 2(b)). This voltage is a complex shape because of the effect of coupling in the auto-transformer from the energised winding (the windings are connected phase-to-phase) to the two windings that share the now-disconnected phase connection. It will of course be appreciated that the common-mode voltage affects both the DC positive and negative lines equally and so, within the DC circuit, only the rectified nominal DC output is seen. The common-mode voltage is present between the generator neutral voltage (which is grounded to the aircraft structure or other chassis type) which can be monitored by looking at the potential difference between the ground or chassis and the DC negative line.

The embodiment therefore makes use of the fact that during normal operation the common-mode output voltage is three times the input frequency but during a missing-phase condition it is equal to the input frequency. In this particular embodiment the input frequency can vary between 360 and 800 Hz, which is typical for a new-generation aircraft using "frequency-wild" generators; the missing-phase condition will produce common-mode frequencies in the same range, while the normal operation condition will produce common-mode frequencies in the range 1,080 to 2,400 Hz. Hence a frequency detector that operates with a threshold frequency in the range 800 to 1,080 Hz can discriminate between normal operation and a missing phase, over the whole input frequency range. Clearly, this scheme can also be applied in the case of a fixed-frequency or closely-regulated-frequency supply.

A benefit of this scheme is that the detector only requires a connection from the motor controller case, which is connected to the aircraft ground system (which is where the generator neutral is also connected) to the motor controller, which is referenced to the negative side of the ATRU's DC output. This connection can be high impedance and can include a capacitor, so that this sensing circuitry does not introduce significant circulating ground currents, and does not prevent DC isolation testing between the electronic circuitry and ATRU DC output, and the pump case. The result is that no connection is required between the electronics and the three-phase input supply. This has a particular benefit in the case of the fuel pump in which this invention is embodied, because the ATRU is immersed in fuel to provide active cooling (and thereby allow a further weight reduction), and sealed feed-through connections are required to link the TRU to the electronics, which are not immersed in fuel. There are two of these feed-throughs carrying the positive and negative DC output of the ATRU to the electronics, and the invention has removed the need to bring a further three voltages via feed-through connectors. This offers a cost saving and a valuable space saving, and is also substantially lower cost than a transformer-based alternative.

The frequency detector works well for missing phase detection. It can also be used to detect a loss of input voltage if the fastest possible response is not required. The signal amplitude detector works well for missing-phase detection, and can be used also for fast detection of a loss of input voltage.

Fast detection of an input supply drop-out has benefits if a sensorless square-wave drive is being used, which requires the bridge drive to be switched off within 1 millisecond of the input power being switched off, in order to be able to provide a hot restart when input power is reapplied (that is, in order for the controller to successfully be able to keep track of the motor's rotor position while the power is disconnected). The input stage of the missing-phase detector serves to provide this function, and is able to detect a loss of input power in less than 1 millisecond.

In this embodiment there are therefore a number of circuit modules that process the common-mode voltage referenced here to the generator neutral voltage to extract information to determine the condition of the 3-phase supply, namely whether a phase is missing or whether the input supply has dropped out altogether.

The common-mode voltage is supplied to a neutral voltage sensor shown generally at 28. Here the neutral voltage is picked up on a capacitor 30, which couples the AC component of the common-mode signal to resistors 32 and 34, and thence to an op-amp 33 whose output, labelled Neut Atten, is an inverted version of the input to the neutral voltage sensor 28, attenuated by a known ratio, and with a 5V offset. The rescaled Neut Atten signal is then used to drive the missing-phase detector 38 and low-input detector indicated generally at 36.

In the low input detector 36, the scaled common-mode voltage (Neut Atten) is fed to a comparator IC201*a*, which gives a square wave out on pin 2, whose edges coincide with the times that the Neut Atten signal crosses the 5V ref line, which is also the average value of the Neut Atten signal. The square wave on IC210*a* pin 2 feeds the charge pump formed by C245 & C246, and D205 & D206, with R211 acting as the load. When input power is present, the charge pump puts several volts on TP818, so that the low-voltage detection (LVD) comparator sees it being higher than the 1V reference. Conversely, when input power is not present (but the Auxiliary Power Supply (APS) is still working), the charge pump output falls to zero, and the LVD comparator sees it being lower than the 1V reference.

Hence the LVD comparator 52 output state is high or low depending on whether input power is present or not.

The missing phase detector 38 is made up of a precision f-V circuit 39 and an averager circuit 40 for receiving the output of the precision f-V circuit 39. In the precision f-V circuit 39, the Neut Atten signal from neutral voltage sensor 28 is applied to the comparator IC201*d* which gives a square wave out whose edges correspond with the times that the Neut Atten signal crosses its average value, which is 5V. IC202 buffers the voltage, and being CMOS, powered from an accurate 5V supply, produces an output that switches between zero and an accurate 5V reference, with some series resistance. Connecting this output to a CR circuit C251/R249 produces an edge followed by an exponential delay towards the 0V line. The average value of this decay is precisely proportional to the product of the 5V reference and the CR time constant (and does not depend on the series output resistance of the CMOS gate IC202). IC200*d* and D213 form a precision rectifier. The op-amp reduces the effective diode voltage to approximately the input offset voltage of IC200*d*, which is a few mV. This constrains the output of C251 to be only positive, so the output across R249 is a series of positive-going jumps followed by exponential decays. As long as the decay time is short enough (say less than 25% of the period), the average value of this voltage is accurately proportional to the input frequency. IC810*a* buffers the output voltage across R249, to send to the averaging circuit 41.

In the averaging circuit 41 the buffered output from IC801*a* of the precision f-V circuit 39 is supplied to a differential low-pass filter made up by R250-253 and C252 & 253 to average the pulses and provide voltage gain. R266 can be an SOT (select on test) component to make fine adjustments to the gain for initial setting up. R254 and C254 form a second stage low-pass filter.

The filtered output labelled CPDet is now a DC voltage with a small ripple, the DC voltage being proportional to frequency, and scaled so as to give 5V for a 900 Hz input. This signal is compared with a 5V reference at the input of a comparator 54, and so the comparator output is low or high depending whether the frequency is less than or greater than 900 Hz. As noted above, a frequency of 800 Hz or less represents a missing-phase condition, and a frequency of 1,080 Hz or more means there is no missing phase, hence the comparator output state acts as a missing phase signal.

Accordingly the described embodiment provides a missing-phase detector and fast-acting low input voltage detector for use with a 3-phase power supply and a 12-pulse transformer-rectifier unit (TRU), such as is commonly used in aircraft, and which responds to the amplitude and/or frequency of the common-mode signal. The embodiment has the advantage that when the circuitry that uses the TRU's DC output is referenced to one of the DC rails (which is normal practice), the detector does not need a connection to the three-phase input supply, but instead uses the generator neutral/common ground connection, and can be coupled to this capacitively, so it does not introduce a ground leakage current. This has advantages in the design in which it is used because it is used in a fuel pump where the TRU is in fuel to keep it cool, and the electronic circuitry is in a dry sealed area, such that interconnections between the electronics and the TRU require feed-through links which are bulky and expensive to produce.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A method of detecting a missing phase in a 3-phase twelve-pulse autotransformer rectifier unit (ATRU), the ATRU, in use, receiving a 3-phase input and delivering a rectified nominal DC output on which a common-mode voltage is impressed, the method comprising:
monitoring, using a monitoring circuit, at least one of a frequency or an amplitude of the common-mode voltage so as to determine whether there is a missing phase in the 3-phase input, wherein the monitoring circuit is not connected to the 3-phase input.

2. The method of claim 1, wherein the frequency of the common-mode voltage is detected, and
wherein a missing phase event is determined if the frequency of the common-mode voltage is below a preset threshold frequency.

3. The method of claim 2, wherein the monitoring circuit comprises an analog circuit.

4. The method of claim 2, wherein the monitoring circuit comprises a digital circuit.

5. The method of claim 1, wherein the amplitude of the common-mode voltage is detected, and
wherein a missing phase event is determined if the amplitude of the common-mode voltage exceeds a preset, threshold.

6. A method of detecting an input supply drop out in a 3-phase twelve-pulse autotransformer rectifier unit (ATRU), the ATRU, in use, receiving a 3-phase input and delivering a rectified nominal DC output on which a common-mode voltage is impressed, the method comprising:
monitoring, using a monitoring circuit, at least one of a frequency or an amplitude of the common-mode voltage so as to determine whether there is an input supply drop, wherein the monitoring circuit is not connected to the 3-phase input.

7. The method of claim 6, wherein the amplitude of the common-mode voltage is monitored and compared with a predetermined threshold amplitude.

8. The method of claim 5, wherein the monitoring circuit comprises an analog circuit.

9. The method of claim 5, wherein the monitoring circuit comprises a digital circuit.

10. The method of claim 1, wherein the common-mode voltage is detected relative to a 3-phase generator neutral voltage.

11. An apparatus for detecting a missing phase in a 3-phase twelve-pulse autotransformer rectifier unit (ATRU), the ATRU, in use, receiving a 3-phase input and delivering a rectified nominal DC output on which a common-mode voltage is impressed, the apparatus comprising:
a monitoring circuit configured to monitor at least one of a frequency or an amplitude of the common-mode voltage so as to determine whether there is a missing phase in the input, wherein the monitoring circuit is not connected to the 3-phase input.

12. The apparatus of claim 11, wherein the monitoring circuit is configured to monitor the amplitude of the common-mode voltage and to determine if the amplitude is less than a predetermined threshold amplitude.

13. The method of claim 7, wherein the monitoring circuit comprises an analog circuit.

14. The method of claim 7, wherein the monitoring circuit comprises a digital circuit.

* * * * *